(12) United States Patent  
Vangal et al.

(10) Patent No.: US 12,307,747 B2
(45) Date of Patent: May 20, 2025

(54) IN-SITU DETECTION OF ANOMALIES IN INTEGRATED CIRCUITS USING MACHINE LEARNING MODELS

(71) Applicant: Intel Corporation, Santa Clara, CA (US)

(72) Inventors: Sriram R. Vangal, Portland, OR (US); Hyochan An, Ann Arbor, MI (US); Vivek K. De, Beaverton, OR (US); Narayan Srinivasa, San Jose, CA (US); Farzin G. Guilak, Beaverton, OR (US); Miguel Bautista Gabriel, Austin, TX (US); Pratik Dasharathkumar Patel, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 646 days.

(21) Appl. No.: 17/549,583

(22) Filed: Dec. 13, 2021

(65) Prior Publication Data

US 2022/0101625 A1   Mar. 31, 2022

(51) Int. Cl.
*G06V 10/774*   (2022.01)
*G06N 3/04*   (2023.01)
(Continued)

(52) U.S. Cl.
CPC ............. *G06V 10/774* (2022.01); *G06N 3/04* (2013.01); *G06V 10/23* (2022.01); *G06V 10/761* (2022.01);
(Continued)

(58) Field of Classification Search
CPC .... G06V 10/774; G06V 10/23; G06V 10/761; G06V 10/771; G06N 3/04; G06N 3/063;
(Continued)

(56) References Cited

U.S. PATENT DOCUMENTS 10,896,351 B2 *   1/2021   Kandemir ........... G06F 18/2178
11,533,326 B2 *   12/2022   Salunke ................. G06N 20/10
(Continued)

FOREIGN PATENT DOCUMENTS

EP              4141715 A1 *   3/2023   ............. G01C 21/30
WO     WO-2021081370 A1 *   4/2021   ......... G06K 9/00523

*Primary Examiner* — Mahendra R Patel
(74) *Attorney, Agent, or Firm* — Akona IP PC

(57) ABSTRACT

An integrated circuit (IC) is provided for in-situ anomaly detection. Sensors in the IC generates sensor datasets including information indicating conditions in the IC. A processing unit in the IC uses a sensor dataset and a model to detect and classify the anomaly. The processing unit may filter the sensor dataset, extract features from the filtered sensor dataset, and input the features into the model. The model outputs one or more classifications of the anomaly. A feature may be a distance vector that represents a difference between a data value in the filtered sensor dataset from a reference data value. The model may be a network of bit-cells in the IC. The model may be continuously trained in-situ, i.e., on the IC. The processing unit may provide the classifications to another processing unit in the IC. The other processing unit may mitigate the anomaly based on the classifications.

20 Claims, 9 Drawing Sheets

(51) Int. Cl.
*G06V 10/22* (2022.01)
*G06V 10/74* (2022.01)
*G06V 10/771* (2022.01)
*G11C 29/12* (2006.01)
*G11C 29/40* (2006.01)
*G11C 29/42* (2006.01)

(52) U.S. Cl.
CPC ........ *G06V 10/771* (2022.01); *G11C 29/1201* (2013.01); *G11C 29/42* (2013.01); *G11C 2029/4002* (2013.01)

(58) Field of Classification Search
CPC ...... G06N 3/08; G11C 29/1201; G11C 29/42; G11C 2029/4002; G11C 2029/0401; G11C 29/028; G11C 29/04; G11C 29/08; G11C 29/16; G11C 29/44; G11C 29/10; G06F 2218/04; G06F 2218/12
USPC ........................................................ 382/159
See application file for complete search history.

(56) References Cited

U.S. PATENT DOCUMENTS

| | | | | |
|---|---|---|---|---|
| 11,537,900 | B2* | 12/2022 | Yoon | G06N 3/045 |
| 11,568,181 | B2* | 1/2023 | Sagi | G06V 10/98 |
| 11,575,697 | B2* | 2/2023 | Palani | G06N 3/088 |
| 11,645,293 | B2* | 5/2023 | Pelloin | G06F 16/2477 706/11 |
| 11,823,366 | B2* | 11/2023 | Kumar | G06F 18/217 |
| 11,947,627 | B2* | 4/2024 | Wigglesworth | G06F 18/2148 |
| 2006/0047617 | A1* | 3/2006 | Bacioiu | G06N 3/08 717/124 |
| 2012/0137367 | A1* | 5/2012 | Dupont | G06F 21/00 726/25 |
| 2016/0352764 | A1* | 12/2016 | Mermoud | H04L 63/1425 |
| 2019/0166024 | A1* | 5/2019 | Ho | H04L 43/0823 |
| 2019/0188212 | A1* | 6/2019 | Miller | H04L 63/145 |
| 2019/0391891 | A1* | 12/2019 | Gupta | G06N 3/043 |
| 2021/0058415 | A1* | 2/2021 | Sanzgiri | G06N 20/00 |
| 2021/0342652 | A1* | 11/2021 | Glassman | G06F 18/251 |
| 2022/0004935 | A1* | 1/2022 | Lakshmanan | G06N 7/01 |
| 2022/0262108 | A1* | 8/2022 | Hida | G06N 3/088 |

* cited by examiner

IN-SITU DETECTION OF ANOMALIES IN INTEGRATED CIRCUITS USING MACHINE LEARNING MODELS

TECHNICAL FIELD

This disclosure relates generally to integrated circuits (IC), and more specifically, to in-situ detection of anomalies in IC using machine learning models.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor chips and causes increased complexity in IC design. While the complexity of IC design has enabled performance, area, and cost scaling of information processing technologies, it is becoming imperative to develop new techniques to ensure reliable operation and performance of ICs.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
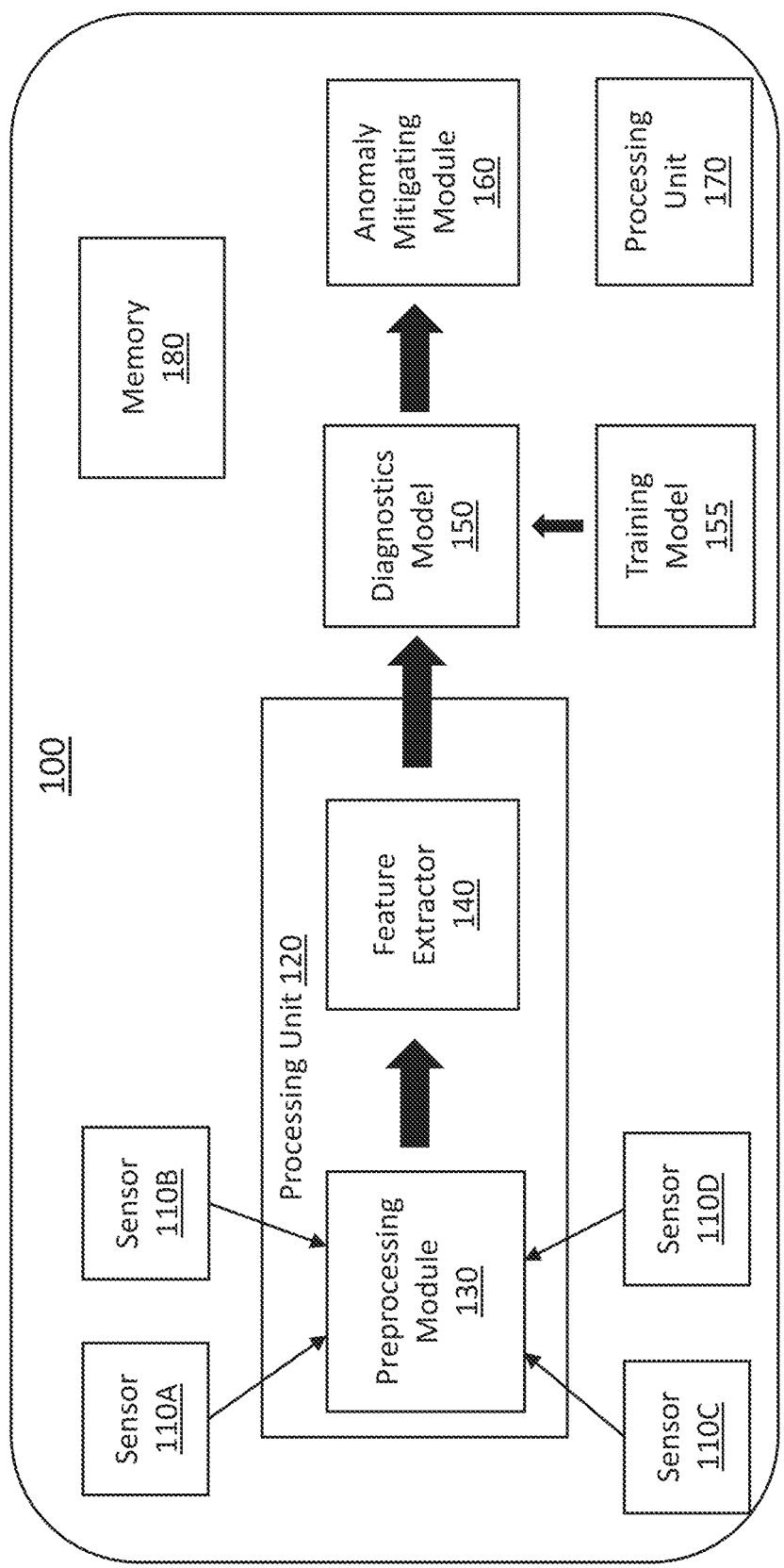
FIG. 1 a block diagram of an IC for in-situ detection of anomalies, in accordance with various embodiments.

ICs are usually rigorously screened at manufacturing time for defects and functional failures. However, the complexity of integrating billions of devices and interconnects on ICs means that the ICs are also subject to anomalies, such as clock jitter, voltage ripple, high temperature, and so on. The anomalies can cause reliability issues and malicious security attacks during operations of the ICs. The anomalies can arise from silicon reliability issues or from malicious attacks during in-field operation of the ICs. Therefore, it is important to detect anomalies in real-time in ICs during operation. Sensors have been integrated into ICs for the purpose of monitoring the conditions of the ICs during their operations. However, effectiveness of these techniques is limited for various reasons. First, many sensor-based techniques have been limited to simply comparing sensor data against pre-calibrated thresholds, which fails to provide accurate and efficient detection of anomalies. Such systems are often brittle and susceptible to error if operating conditions require thresholds different from those determine during pre-calibration. Second, these techniques usually require transmission of sensor data to external systems to detect anomalies and therefore, they fail to detect and mitigate anomalies in a timely manner. The transmission of sensor data also consumes computational resources of the ICs. Therefore, improved technologies for detecting anomalies, such as technologies for embedded, low-power, fast anomaly detection, are needed.

The present invention relates to ICs capable of efficient in-situ detection of anomalies. An example IC includes one or more sensors that generate sensor datasets, a processing unit that pre-processes and extracts features from the sensor datasets, and a machine learning model ("diagnostics model") trained to receive the features and to output classifications of anomalies. The one or more sensors may be distributed across a die of the IC and generate continuous data. The IC may also include a component (e.g., an additional processing unit) that mitigates the anomalies based on the output of the anomaly detection model. As the detection of the anomalies is conducted on the IC itself (i.e., the detection is in-situ), it is faster than techniques that require external systems to process sensor data to detect anomalies. In some embodiments, the detection and mitigation of anomalies can be real-time or near real-time.

The diagnostics model is trained by using machine learning techniques. In some embodiments, the training of the diagnostics model includes determining internal parameters of the diagnostics model. An internal parameter is a parameter inside the diagnostics model and used by the diagnostics model for determining whether the IC has an anomaly in a classification based on the features. In some embodiments, the internal parameters of the diagnostics model include reference datasets for a variety of classifications of anomalies. A reference dataset can correspond to one or more classifications. The diagnostics model can detect and classify anomalies by comparing features extracted from sensor datasets with features extracted from the reference datasets.

In some embodiments, the diagnostics model can be continuously trained in-line, i.e., on the IC itself. For instance, unmatched features and their labels can be used as new training data to further train the diagnostics model. Unmatched feature are features based on which the diagnostic model fails to detect or classify an anomaly. The diagnostic model may determine that the classification of the unmatched features is unknown or determine that the likelihood of the unmatched features falling into any of the known classifications is too low (e.g., lower than a threshold likelihood). One or more labels of the unmatched features may be determined in-line or off-line. A label represents whether the unmatched features indicate a normal condition, an anomaly (e.g., failure, pre-failure, etc.) in a classification. The unmatched features and their labels can be stored in a memory on the IC. By using such a diagnostics model, the in-situ detection of anomaly is assisted by machine learning technologies and provides a better accuracy in detecting anomalies than techniques that simply compare sensor data against pre-calibrated thresholds.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side" to explain various features of the drawings, but these terms are simply for ease of discussion, and do not imply a desired or required orientation. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art.

The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

In addition, the terms "comprise," "comprising," "include," "including," "have," "having" or any other variation thereof, are intended to cover a non-exclusive inclusion. For example, a method, process, device, or system that comprises a list of elements is not necessarily limited to only those elements but may include other elements not expressly listed or inherent to such method, process, device, or system. Also, the term "or" refers to an inclusive "or" and not to an exclusive "or."

The systems, methods and devices of this disclosure each have several innovative aspects, no single one of which is solely responsible for all desirable attributes disclosed herein. Details of one or more implementations of the subject matter described in this specification are set forth in the description below and the accompanying drawings.

Example IC

FIG. 1 a block diagram of an IC 100 capable of in-situ detection of anomalies, in accordance with various embodiments. The IC 100 includes sensors 110A-D, a processing unit 120, an diagnostics model 150, a training module 155, an anomaly mitigating module 160, another processing unit 170, and a memory 180. In other embodiments, the IC 100 may include fewer, more, or different components. For instance, the IC 100 may include a different number of sensors 110. A single sensor is referred to herein as sensor 110, and multiple sensors are referred to collectively as sensors 110.

The sensors 110 captures data reflecting operating conditions in the IC 100. A sensor 110 may be a clock sensor, temperature sensor, electrical voltage sensor, electrical current sensor, ECC (error correcting code)-SRAM (static random-access memory) core, other types of IC sensors, or some combination thereof. The sensors 110 outputs sensor datasets. A sensor dataset includes information indicating one or more conditions in the IC. In some embodiments, a sensor dataset includes sensor data from all the sensors 110. In other embodiments, a sensor dataset includes sensor data from a subset of the sensors 110 in the IC 100. A sensor dataset may include time-series data, meaning each data value in the sensor dataset is associated with a timestamp. Different data values can have different timestamps and indicate conditions of the IC 100 at different times.

The processing unit 120 generates features from sensor datasets from the sensors 110. The processing unit 120 may be an in-memory processor. The sensor datasets and features can be stored in the processing unit 120. In the embodiment of FIG. 1, the processing unit 120 includes a preprocessing module 130 and a feature extractor 140. The preprocessing module 130 processes a sensor dataset before features are extracted from the sensor dataset. In some embodiments, the preprocessing module 130 filters noise in the sensor dataset from the signals of interest in the sensor dataset from signals of interest in the sensor dataset. The preprocessing module 130 can generate a filtered sensor dataset by including the signals of interest. The preprocessing module 130 may perform other data processing operations on the sensor dataset. For instance, the preprocessing module 130 may detect missed values in the sensor dataset, determine a value for each missed value, and add the determined values to the sensor dataset.

The feature extractor 140 extracts features from the filtered sensor dataset. A feature is an individual measurable characteristic of the sensor dataset that is critical for detecting and classifying the anomaly. In some embodiments, the feature extractor 140 identifies (possibly preprocessed) sensor data values in the sensor dataset as features. Each sensor data value is associated with a corresponding timestamp.

The feature extractor 140 may identify the sensor data values based on their timestamps. For instance, the feature extractor 140 identifies critical timestamps and extracts the sensor data values associated with the critical timestamps from the sensor dataset as the features. In other embodiments, the features can be other types of measurable characteristics of the sensor dataset. In some embodiments, the feature extractor 140 can extract features from noise in the sensor dataset.

The diagnostics model 150 receives features of a sensor dataset from the feature extractor 140 and outputs one or more classifications of an anomaly in the IC 100. The diagnostics model 150 is a model that has been trained (e.g., by the training and support system 210 described below in conjunction with FIG. 2) to receive features from the processing unit 120 and to output presence and classifications of anomalies. For instance, the diagnostics model 150 compares features of the sensor dataset with features of one or more reference datasets to detect and classify anomalies indicated in the sensor dataset. A reference dataset represents a classification of anomaly. For instance, the diagnostics model 150 determines a difference between features of a sensor dataset and features of a reference dataset. The diagnostics model 150 determine that the features of the sensor dataset match the features of the reference dataset in embodiments where the weighted sum of distance vectors is no larger than a threshold. In response to determining that there is a match, the diagnostics model 150 outputs the presence of the anomaly in the IC 100 and the classification of the anomaly that is represented by the reference dataset. In embodiments where the weighted sum of distance vectors is above the threshold, the diagnostics model 150 determines that the features of the sensor dataset do not match the features of the reference dataset. The diagnostics model 150 may output that the classification of the anomaly in the IC 100 is unknown or may output a low probability that the IC 100 had an anomaly in a classification. More details regarding comparing features of sensor datasets with features of reference dataset are described below in conjunction with FIG. 5.

The training module 155 continuously trains the diagnostics model 150 based on unmatched features. The training module 155 identifies unmatched features from the features generated by the feature extractor 140. For instance, the training module 155 identifies features based on which the diagnostics model 150 outputs unknown classification, low probabilities of the presence of an anomaly, or low probability for the classifications represented by the reference datasets in the diagnostics model 150. In another example, the training module 155 identifies features based on which the diagnostics model 150 has detected presence of an anomaly and output one or more classifications of the anomaly as matched features and identifies the other features as unmatched features. In some embodiments, the training module 155 may also determine labels of unmatched features. A label represents whether one or more unmatched features indicate a normal condition or an anomaly in a classification. The unmatched features and labels are used as training data to further train the diagnostics model 150. In other embodiments, labels of unmatched features are determined by an external system or a user of the IC 100. More details regarding continuously training the diagnostics model 150 is described below in conjunction with FIG. 6A.

In some embodiments, the diagnostics model 150 is a network with internal parameters. The internal parameters of the diagnostics model 150 are trainable, meaning the values of the internal parameters are determined during a process of training the diagnostics model by using machine learning techniques. In an embodiment, the internal parameters of the diagnostics model 150 are determined using one or more reference datasets. Each reference dataset has been previously generated, e.g., prior to training of the diagnostics model 150, for a particular anomaly classification. For instance, the reference dataset includes information indicating one or more normal conditions of the IC 100 in the classification. A reference dataset may be used as a reference against which the extracted features are compared to determine whether the extracted features indicate a normal condition or an anomaly in the corresponding classification. For instance, the diagnostics model 150 measures a similarity or difference between the reference dataset and the extracted features. In embodiments where the similarity is below a threshold or the difference is beyond a threshold, the diagnostics model 150 determines that an anomaly in the classification of the reference dataset occurred in the IC 100. The diagnostics model 150 may measure the similarity or difference by using various algorithms, such as weighted sum of differences of individual values, cross correlation, interval matching, other type of statistical algorithms, or some combination thereof. Parameters of the algorithm used by the diagnostics model 150 to measure the similarity or difference are also trainable internal parameters of the diagnostics model 150.

The network of the diagnostics model 150 is in the IC 100. In some embodiments, the network includes processing elements that processes the features. In an example where a feature is a sensor data value associated with a timestamp, the processing element determines a distance vector measuring a difference between the sensor data value and a reference value in a reference dataset that represents a normal condition of the IC 100 in a particular classification. The reference value may have the same timestamp with the sensor data value. As there can be multiple features, the network determines multiple distance vectors and can further determine a weighted sum of the distance vectors, e.g., by an aggregating circuit in the network. The network then uses the weighted sum to determine whether the IC 100 has an anomaly in the classification. As the weighted sum is determined based on the reference dataset representing the normal condition of the IC 100 in the particular classification, the weighted sum indicates whether the IC has a normal condition or anomaly in the particular classification. In some embodiments, the network compares the weighted sum with one or more threshold values. For instance, the network outputs that the IC 100 has an anomaly in the classification after the network determines that the weighted sum is equal to or larger than a threshold value. More information of the network of the diagnostics model 150 are described below in conjunction with FIGS. 6A-6B.

The anomaly mitigation module 160 mitigates anomalies based on the classifications of the anomalies. In some embodiments, the anomaly mitigation module 160 receives a classification of an anomaly in the IC 100 from the diagnostics model 150. The anomaly mitigation module 160 may take various actions for mitigating the anomaly. In an embodiment, the anomaly mitigation module 160 determines a solution for resolving the anomaly. The solution may be a change to the IC 100 or to a different system coupled to the IC 100. For instance, for an anomaly classification of too high electrical voltage, the solution can be to reduce the electrical voltage provided by a power supply, or to stop the power supply from providing power to the IC 100. The anomaly mitigation module 160 may take an action itself to execute the solution, or provide the solution to a different system and instruct the different system to execute the solution. The different system may be a component in the IC 100, such as the processing unit 170 or memory 180, or a system external to the IC 100, such as a power supply, a controller that controls the operation the IC 100, or other types of devices coupled to the IC 100. In another embodiment, the anomaly mitigation module 160 generates a message describing the classification of the anomaly and sends the message to a different system (e.g., another component in the IC 100 or a system external to the IC 100) for the different system to determine the solution.

The processing unit 170 is used for operations other than detecting anomalies. In some embodiments, the processing unit 170 is used for mitigating anomalies based on the output of the diagnostics model 150. For instance, the processing unit 170 determines a solution to resolve an anomaly based on one or more classifications of the anomaly. The processing unit 170 may execute the solution to mitigate the anomaly or instruct another component of the IC 100 or a different system coupled to the IC 100 to execute the solution.

The memory 180 may store data related to detecting or mitigating anomalies. The memory 180 may also store other types of data.

Example IC Environment

Figure 2:
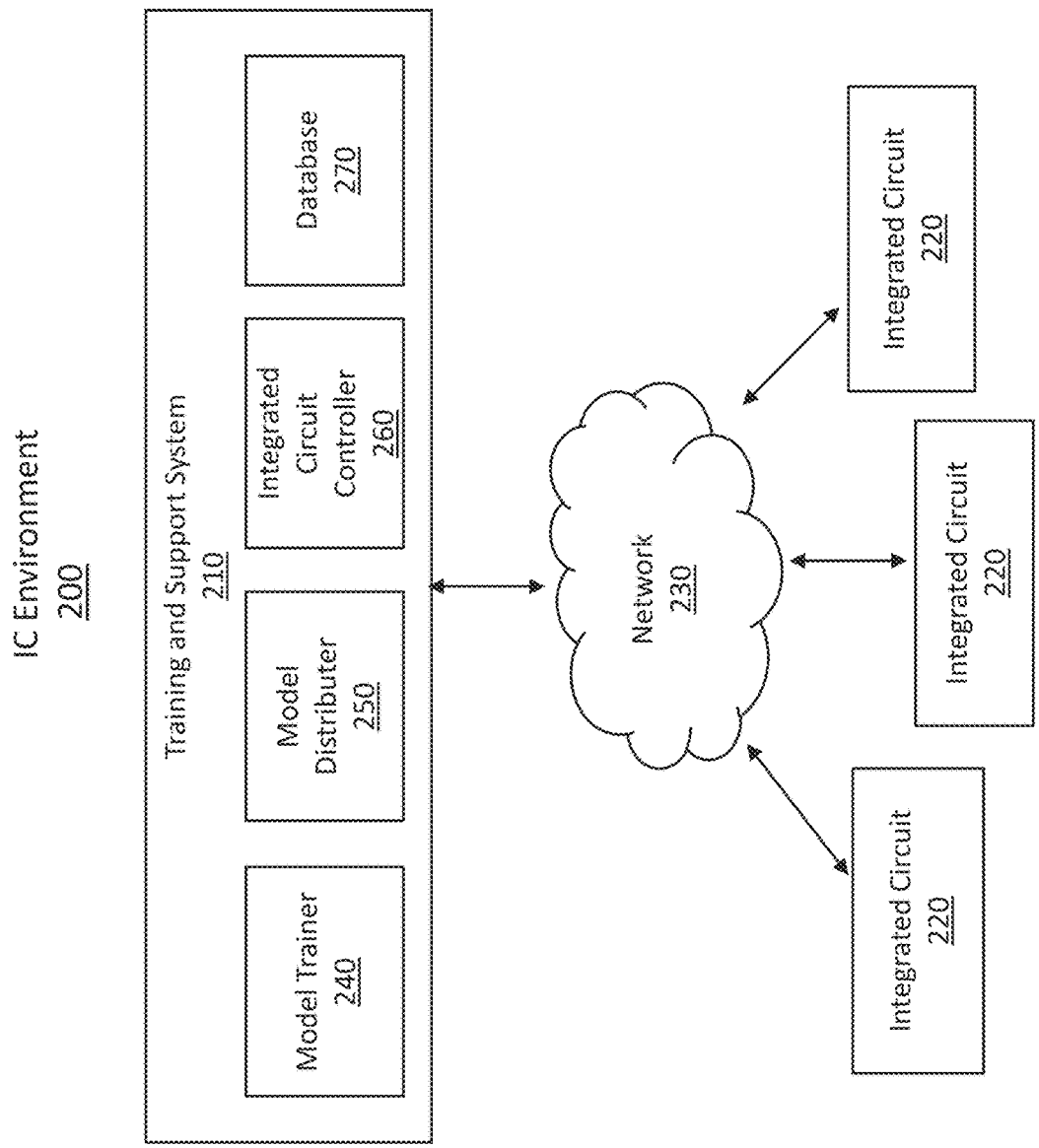
FIG. 2 illustrates a machine learning environment, in accordance with various embodiments.

FIG. 2 illustrates an IC environment 200, in accordance with various embodiments. The IC environment 200 includes a training and support system 210, a plurality of ICs 220, and a network 230. In other embodiments, the IC environment 200 may include fewer, more, or different components.

The training and support system 210 manages the ICs 220. For instance, the training and support system 210 facilitates detection, classification, and mitigation of anomalies in the ICs 220. In the embodiment FIG. 2, the training and support system 210 includes a model trainer 240, a model distributer 250, an IC controller 260, and a database 270. In other embodiments, the training and support system 210 may include fewer, more, or different components.

The model trainer 240 trains anomaly detection models, such as the diagnostics model in FIG. 1. The model trainer 240 may generate a training set that includes a plurality of training samples. Each training sample includes a training object and a label. The training object, for example, may be a sensor dataset generated by one or more sensors in an IC, e.g., the IC 100 or 220. The label indicates the reference classification of an anomaly in the IC. The model trainer may extract features from the training objects and use the labels as ground truth classifications to train an anomaly detection model. In some embodiments, the model trainer 240 uses a supervised training process to train the anomaly detection model. During the training process, the model trainer 240 generates internal parameters of the anomaly detection model. The internal parameters may include reference datasets indicating normal and anomalous conditions of ICs, parameters in algorithms used to measure differences between reference datasets and sensor datasets, other types of parameters that the diagnostics model may use to detect anomalies, or some combination thereof. The model trainer 250 may also validate the performance of the trained anomaly detection model. The model trainer 250 may also continuously train the diagnostics model based on new training samples. More information about the model trainer 250 are described below in conjunction with FIG. 3.

The model distributer 250 distributes anomaly detection models trained by the model trainer 250 to the ICs 220. In some embodiments, the model distributer 250 receives a request for an diagnostics model from an IC 220 through the network 230. The request may specify one or more classifications of anomaly that the IC 220 intends to detect. In an embodiment, the distributer may instruct the model trainer 240 to train an diagnostics model in accordance with the request. Alternatively or additionally, the model trainer 240 may retrieve a pre-trained anomaly detection model, e.g., from the database 270, and send the retrieved diagnostics model to the IC 220. In another embodiment, the model distributer 250 may select the diagnostics model from a group of pre-existing anomaly detection models based on the request. The model distributer 250 may select an diagnostics model for a particular IC 220 based on the size of the diagnostics model and available computational resources of the IC 220.

In some embodiments, the model distributer 250 may receive feedback from the IC 220. For example, the model distributer 250 receives new training data from the IC 220 and may send the new training data to the model trainer 240 for further training the anomaly detection model. The new training data may include a sensor dataset generated by the IC 220 and an anomaly classification determined based on the sensor dataset. The model distributer 250 can provide the new training data to the model trainer 240 to further train the anomaly detection model. As another example, the feedback includes an update of the available computational resource on the IC 220. The model distributer 250 may send a different diagnostics model to the IC 220 based on the update.

The IC controller 260 controls operations of the ICs 220. For instance, the IC controller 260 monitors the ICs 220. The IC controller 260 may receive messages from an IC 220 that describe an anomaly in the IC 220. The IC controller 260 may analyze the anomaly based on the classifications of the anomaly and provide a solution to the IC 220 for the IC 220 to mitigate the anomaly. Alternatively or additionally, the IC controller 260 may execute the solution itself to mitigate the anomaly for the IC 220. The IC controller 260 may also command the ICs 220 to perform operations. For instance, the IC controller 260 may distribute tasks to the ICs 220 and command the ICs 220 to perform the tasks. The IC controller 260 may monitor resources (e.g., memory size, number of processing elements, etc.) available on the ICs 220 and distribute the tasks based on the available resources.

The database 270 stores data received, used, generated, or otherwise associated with the training and support system 210. For example, the database 270 stores training sets that the model trainer 240 uses to train anomaly detection models. As another example, the database 270 stores internal parameters of the trained anomaly detection models.

The ICs 220 receive anomaly detection models from the model distributer 250 and apply the anomaly detection models for in-situ anomaly detection. An embodiment of an IC 220 is the IC 100 in FIG. 1. In various embodiments, the ICs 220 input sensor datasets generated by in-situ sensors into the anomaly detection models. The anomaly detection models output classifications of anomalies, indicating that anomalies in the classifications have occurred in the ICs 220. The IC 220 may also use the classifications of anomalies for in-situ mitigation of the anomalies. In some embodiments, the IC 220 provides a network of an diagnostics model and runs the diagnostics model based on the internal parameters received from the model distributer 250.

The network 230 supports communications between the training and support system 210 and ICs 220. The network 230 may comprise any combination of local area and/or wide area networks, using both wired and/or wireless communication systems. In one embodiment, the network 230 may use standard communications technologies and/or protocols. For example, the network 230 may include communication links using technologies such as Ethernet, 802.11, worldwide interoperability for microwave access (WiMAX), 3G, 4G, code division multiple access (CDMA), digital subscriber line (DSL), etc. Examples of networking protocols used for communicating via the network 230 may include multiprotocol label switching (MPLS), transmission control protocol/Internet protocol (TCP/IP), hypertext transport protocol (HTTP), simple mail transfer protocol (SMTP), and file transfer protocol (FTP). Data exchanged over the network 230 may be represented using any suitable format, such as hypertext markup language (HTML) or extensible markup language (XML). In some embodiments, all or some of the communication links of the network 230 may be encrypted using any suitable technique or techniques.

Example Model Trainer

Figure 3:
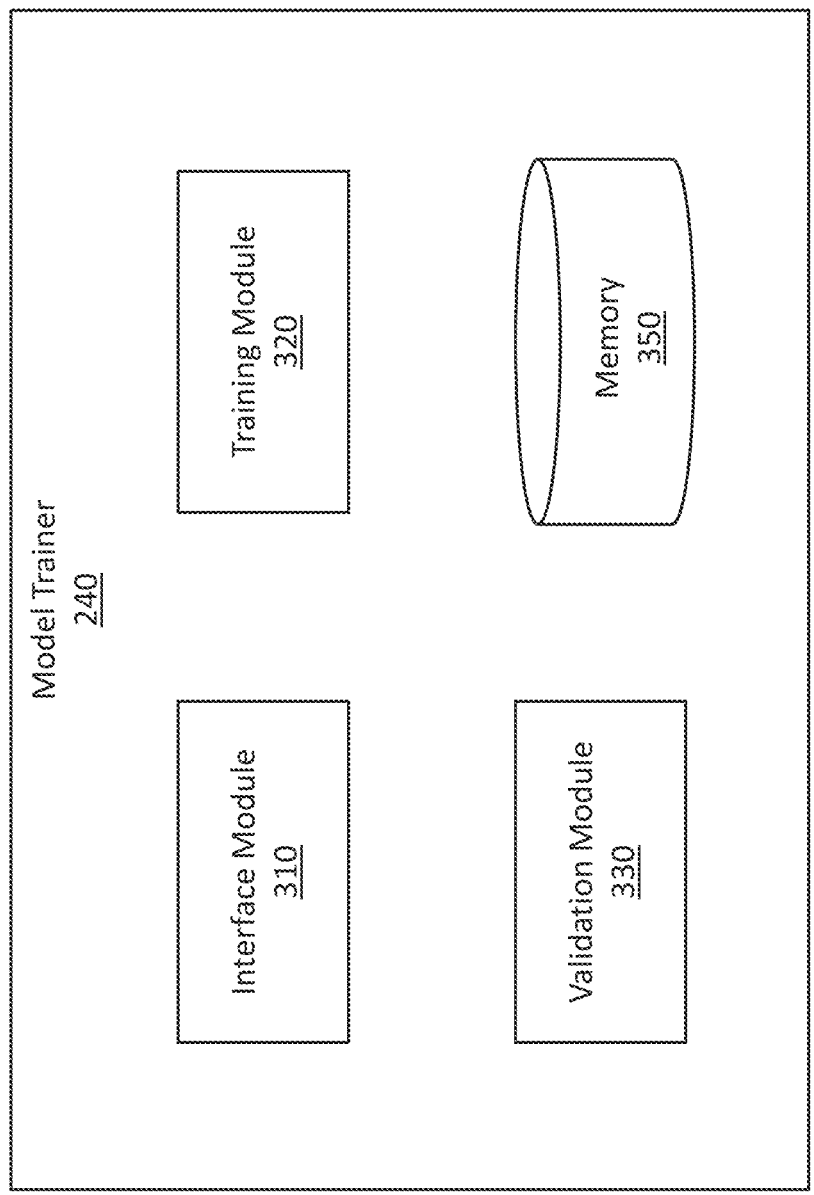
FIG. 3 is a block diagram of a model trainer, in accordance with various embodiments.

FIG. 3 is a block diagram of the model trainer 240, in accordance with various embodiments. The model trainer 240 trains anomaly detection models, an example of which is the diagnostics model 150 in FIG. 1. The model trainer 240 includes an interface module 310, a training module 320, a validation module 330, and a memory 340. In other embodiments, alternative configurations, different or additional components may be included in the model trainer 240. Further, functionality attributed to a component of the model trainer 240 may be accomplished by a different component included in the training and support system 210 or a different system.

The interface module 310 can facilitate communications of the model trainer 240 with other systems. The interface module 310 may support communications of the model trainer 240 with the other components of the training and support system 210, such as the model distributer 250. For instance, the interface module 310 may send trained anomaly detection models to the model distributer 250. The interface module 310 also receives requests for anomaly detection models or new training data from the model distributer 250. The interface module 310 may also facilitate communications of the model trainer 240 with the ICs 220. For instance, the interface module 310 may receive requests for anomaly detection models or new training data from the ICs 220 directly, as opposed to the model distributer 250. The interface module 310 may receive training sets from the database 270.

The training module 320 trains anomaly detection models. The training module 320 applies machine learning techniques to generate an diagnostics model that when applied to sensor datasets, outputs classifications of anomalies. In some cases, confidence score can also be generated by the diagnostics model along with the classifications. As part of training the anomaly detection model, the training module 320 forms a training set. In some embodiments, the training module 320 forms a training set by identifying a positive training set and a negative training set. The positive training set includes sensor datasets generated by ICs that have the property in question, i.e., anomalies occurred in the ICs. The negative training set includes sensor dataset generated by ICs that do not have the property in question, i.e., anomalies did not occur in the ICs.

The training module 320 may extract feature values from the training set, the features being variables deemed potentially relevant to detection of anomalies in various classifications. The feature values extracted by the training module 320 may include, e.g., values, patterns, or other types of variables in the training objects. An ordered list of the features for an object may be herein referred to as the feature vector for the object. In one embodiment, the training module 320 may apply dimensionality reduction (e.g., via linear discriminant analysis (LDA), principal component analysis (PCA), or the like) to reduce the amount of data in the feature vectors to a smaller, more representative set of training data.

The training module 320 may use supervised machine learning to train the classification model, with the feature vectors of the training set serving as the inputs. Different machine learning techniques—such as linear support vector machine (linear SVM), boosting for other algorithms (e.g., AdaBoost), neural networks (e.g., convolutional neural network), logistic regression, naïve Bayes, memory-based learning, random forests, bagged trees, decision trees, boosted trees, or boosted stumps—may be used in different embodiments. The anomaly detection model, when applied to the feature vector extracted from a sensor dataset, outputs a classification of anomaly, such as a Boolean yes/no estimate, or a scalar value representing a probability.

In some embodiments, the training module 320 continuously train an anomaly detection model. For instance, the training module 320 can generate new training sets and re-train the diagnostics model by using the new training sets. A new training set may include a sensor dataset from an IC that uses the diagnostics model to detect an anomaly in a classification and the anomaly in the classification that has been detected by the IC. In some embodiments, the occurrence of the anomaly in the classification has been confirmed, e.g., by a user of the IC. In one embodiment, the training module 320 may iteratively re-train the diagnostics model until the occurrence of a stopping condition, such as the accuracy measurement conducted by the validation module 330 indicates that the diagnostics model may be sufficiently accurate, or a number of training rounds having taken place.

The validation module 330 can validate performance of trained anomaly detection models in classifying anomalies. The validation module 330 may validate the performance of an diagnostics model in classifying anomalies for a particular classification. In some embodiments, a validation set may be formed of additional sensor datasets, other than those in the training sets, classifications of anomalies detected from which have been known. The validation module 330 applies the diagnostics model to the sensor dataset in the validation set to quantify the accuracy of the anomaly detection model. Common metrics applied in accuracy measurement include: Precision=TP/(TP+FP) and Recall=TP/(TP+FN), where precision is how many anomalies the diagnostics model correctly classified (TP or true positives) out of the total it classified (TP+FP or false positives), and recall is how many anomalies the diagnostics model correctly classified (TP) out of the total number of sensor datasets that did have the property in question (TP+FN or false negatives). The F score (F score=2*PR/(P+R)) unifies precision and recall into a single measure. The validation module 330 may further determine whether the diagnostics model is sufficiently accurate based on the accuracy measurement result. In embodiments where the validation module 330 determines that the diagnostics model is not sufficiently accurate, the validation module 330 may instruct the training module 320 to further train the anomaly detection model.

The memory 340 stores data received, generated, used, or otherwise associated with the model trainer 240. For example, the memory 340 stores the training sets used by the training module 320 and validation sets used by the validation module 330. The memory 340 may also store data generated by the training module 320 and validation module 330, such as the internal parameters of trained anomaly detection models, etc. In the embodiment of FIG. 3, the memory 340 is a component of the model trainer 240. In other embodiments, the memory 340 may be external to the model trainer 240 and communicate with the model trainer 240 through a network.

Example Sensor Data Filtering

Figure 4:
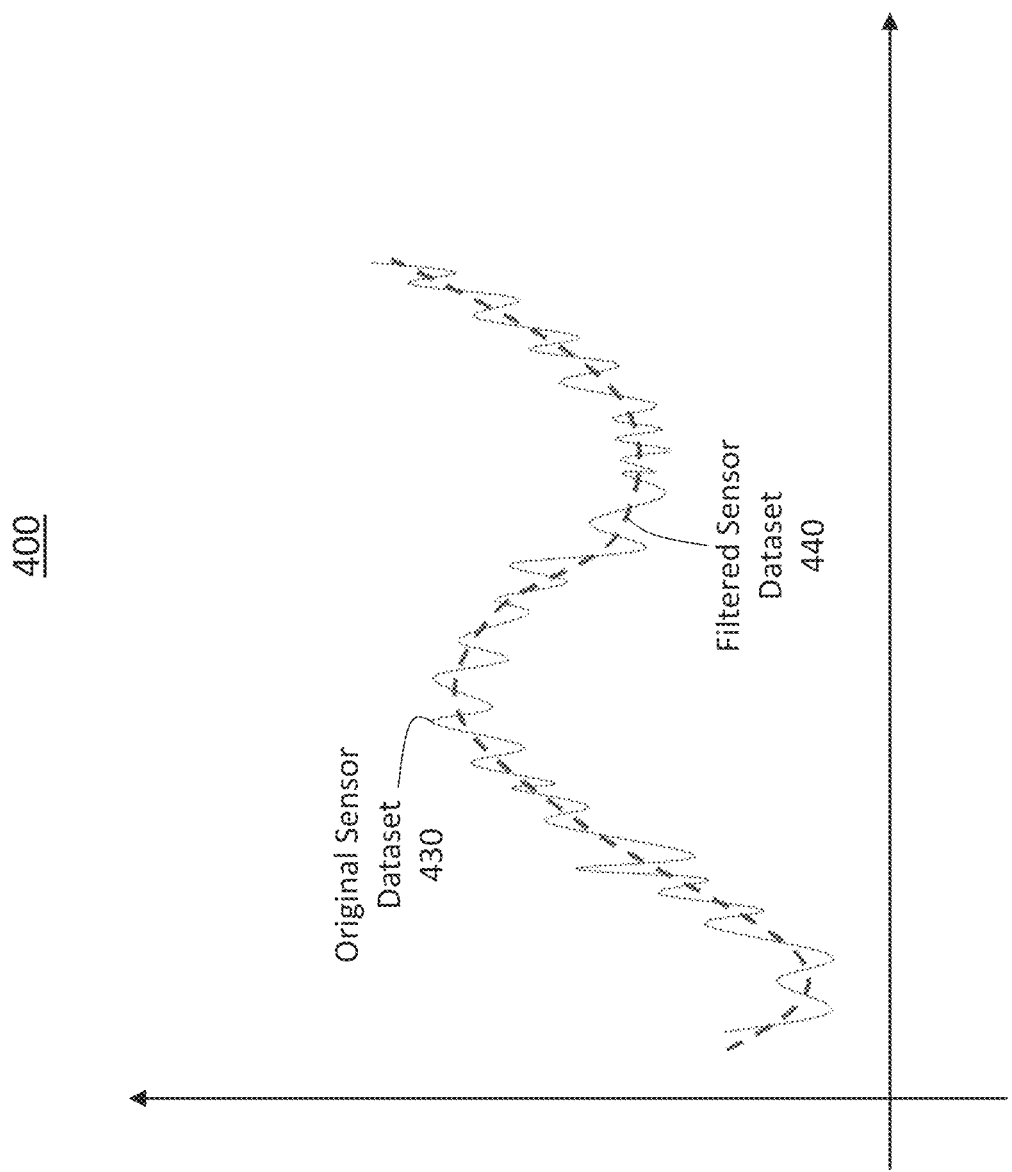
FIG. 4 illustrates filtering a sensor dataset, in accordance with various embodiments.

FIG. 4 illustrates filtering a sensor dataset, in accordance with various embodiments. In the embodiment of FIG. 4, the sensor dataset is generated by one or more sensors in an IC. The sensor dataset is to be used for detecting anomalies in the IC. The sensor dataset includes time-series data, meaning each value in the sensor data set ("sensor data value") corresponds to a time and is associated with a timestamp representing the time. FIG. 4 shows a two-dimensional space. The sensor dataset is represented by a curve 430 in the two-dimensional space. The sensor data values include noises and signals of interest. It can be important to remove noise from the sensor dataset to accurately detect the anomalies; this can be accomplished by applying a digital filter to the sensor dataset to generate a clean signal. The filtered sensor dataset is represented by curve 440 in the two-dimensional space. As shown in FIG. 4, the curve 440 is smother than the curve 430. The filtering of the sensor dataset can be done by the preprocessing module 130 in FIG. 1.

Example Distance Vectors

Figure 5:
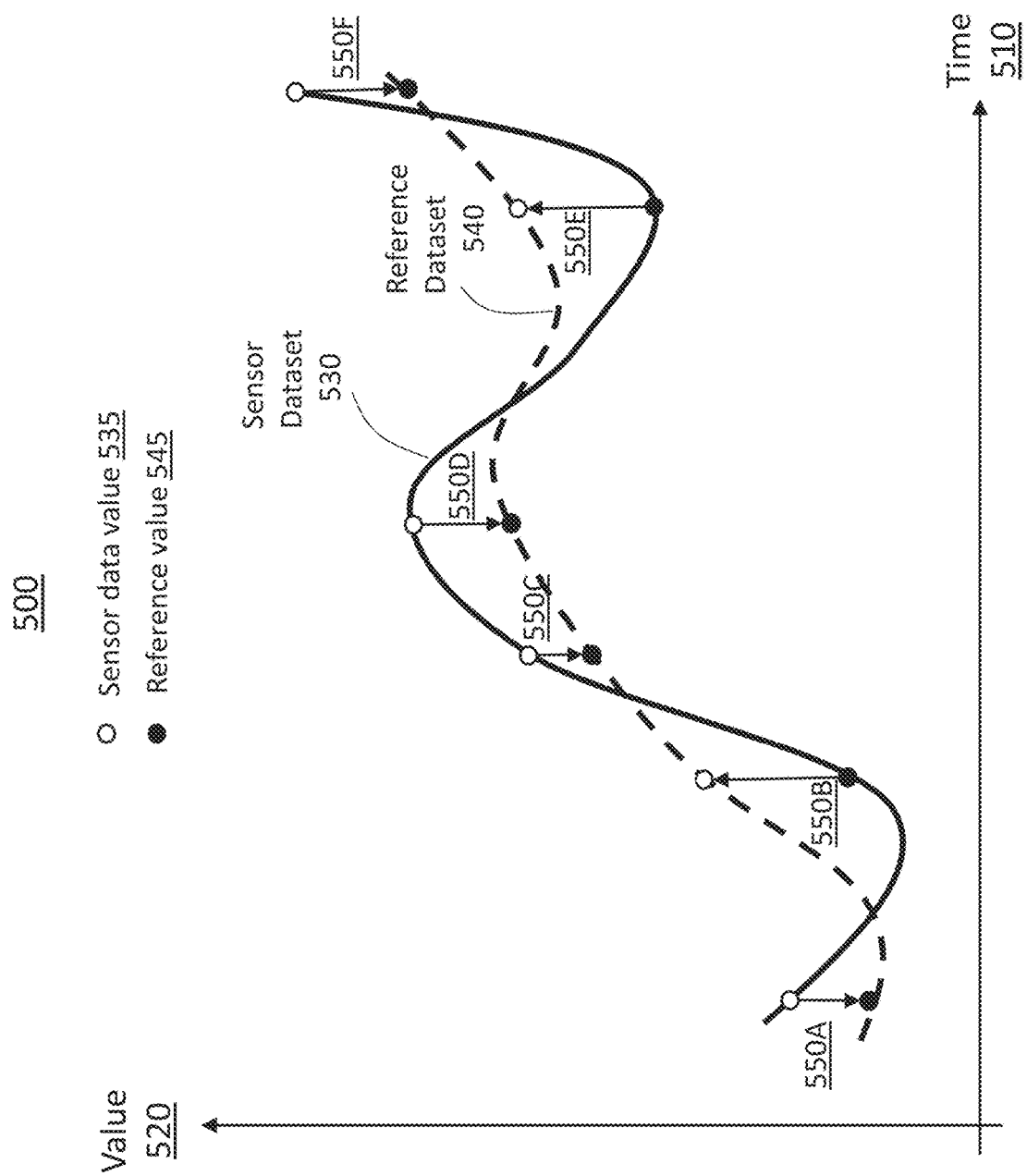
FIG. 5 illustrates distance vectors representing differences between sensor data values and reference values, in accordance with various embodiments.

FIG. 5 illustrates distance vectors representing differences between sensor data values 535 (individually referred to as "sensor data value 535") and reference values 545 (individually referred to as "reference value 545"), in accordance with various embodiments. FIG. 5 shows a two-dimensional space defined by a time axis 510 and a value axis 520. A sensor dataset is represented by a curve 530 in the two-dimensional space. Each point on the curve 530 represents a sensor data value (i.e., a coordinate of the point on the value axis 520) and a timestamp associated with the sensor data value (i.e., a coordinate of the point on the time axis 510). The sensor dataset may be the filtered sensor dataset represented by the curve 440 in FIG. 4. FIG. 5 also shows a curve 540 that represents a reference dataset. Each point on the curve 540 represents a reference value (i.e., a coordinate of the point on the value axis 520) and a timestamp associated with the reference value (i.e., a coordinate of the point on the time axis 510).

As shown in FIG. 5, six sensor data values 535 are identified from the curve 530. The six sensor data values 535 may be used as features of the sensor dataset. For each sensor data value 535, a refence value 545 is identified. The reference value 545 has the same timestamp as the sensor data value 535. Distance vectors 550A-E (collectively referred to as "distance vectors 550" or "distance vector 550") are determined based on the sensor data values 535 and reference values 545. As shown in FIG. 5, each distance vector 550 is a distance from a reference value 545 to the corresponding sensor data value 535. The distance vector 550 is a distance from the point representing the sensor data value to the point representing the reference value along the value axis 520 in the two-dimensional space. The distance vectors 550 have different directions: for instance, the distance vectors 550A, 550C, 550D, and 550F having the same direction as the value axis 520, versus the other distance vectors 550B and 550E have the opposite direction from the value axis 520.

In the embodiment of FIG. 5, a weighted sum of the distance vectors 550 is determined by using an algorithm, which is shown below.

Weighted Sum=$\Sigma w_i(M_i-x_i)$ where i is an integer number in a range from 1 to the number of identified sensor data values (i.e., 6 in the embodiment of FIG. 5 since six sensor data values 535 are identified), w is weight, M is reference value, and x is sensor data value. The weighted sum indicates a difference between the curve 540 and curve 530, i.e., a difference between the reference dataset and the sensor dataset. The weighted sum may be a positive value or negative value. The weighted sum is used to detect whether there is an anomaly in the classification of the reference dataset.

In other embodiments, the difference between the reference dataset and the sensor dataset may be determined by algorithms different from the algorithm for determining the weighted sum. In one example, a score indicating the difference between the reference dataset g(m) and the sensor dataset h(m) is determined by using a cross correlation algorithm:

Score=$g(m)h(m+k)$ where m and k are data indices for the reference dataset g and the sensor dataset h, k can be time shifted relative to m, m is a number between 1 and N, and N is an integer representing the total number of samples in the dataset.

In another example, a score indicating the difference between the reference dataset g(m) and the sensor dataset h(m) is determined by using an interval matching algorithm:

Score=1 if $[g(m)+\text{offset} \geq h(m+k) \geq [g(m)-\text{offset}]$;

Otherwise, Score=0 where m and k are data indices for the reference dataset g and the sensor dataset h, k can be time shifted relative to m, m is a number between 1 and N, N is an integer representing the total number of samples in the dataset, and offset is a threshold for checking if the incoming sample lies within a valid interval.

In some embodiments, it is determined that features of a sensor dataset match features of a reference dataset and that the IC had an anomaly in the classification of the reference database, when the difference between the reference dataset and the sensor dataset is below or equal to a threshold. Similarly, it is determined that features of a sensor dataset do not match features of a reference dataset that the IC did not have any anomaly in the classification of the reference database, when the difference between the reference dataset and the sensor dataset is above the threshold.

Example Network Architecture

Figure 6A:
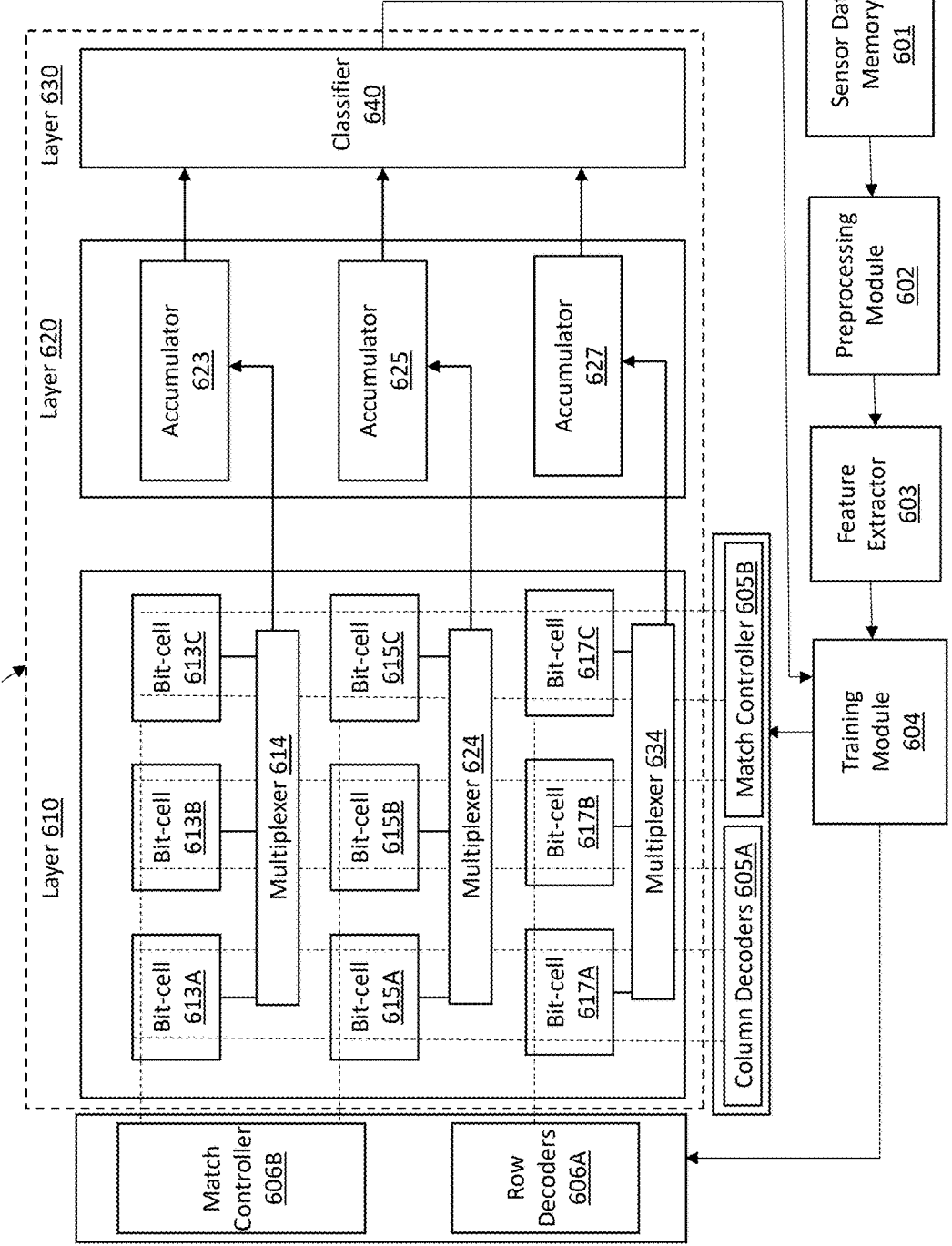
FIG. 6A illustrates an architecture of an example network of a machine learning model, in accordance with various embodiments.

FIG. 6A illustrates an architecture of an example in-situ neural pattern matching engine 600, in accordance with various embodiments. The in-situ neural pattern matching engine 600 may be an embodiment of the diagnostics model 150 in FIG. 1. The diagnostics model 600 includes a sensor data memory 601, a preprocessing module 602, a feature extractor 603, a training model 604, column decoders 605A, match controller 605B, row decoders 606A, match controller 606B, and an diagnostics model 607. In other embodiments, the in-situ neural pattern matching engine 600 may include fewer, more or different components.

The sensor data memory 601 stores raw sensor data generated by one or more sensors. The one or more sensors may be on the same integrated circuit as the in-situ neural pattern matching engine 600. A sensor provides sensor data that reflects one or more operating conditions of the integrated circuit. In some embodiments, the raw sensor data is synchronously input every clock cycle into the in-situ neural pattern matching engine 600. The in-situ neural pattern matching engine 600 may operate on the same clock as the one or more sensors to mitigate data buffer requirements, which saves resources needed by the in-situ neural pattern matching engine 600.

The preprocessing module 602 processes the raw sensor data from the sensor data memory 601. In some embodiments, the preprocessing module 602 separates noises in a sensor dataset from signals of interest in the sensor dataset and generates a filtered sensor dataset by including the signals of interest. The preprocessing module 602 may separate noise from signal of interest by using digital filters. The processing module 602 may be an embodiment of the preprocessing module 130 in FIG. 1.

The feature extractor 603 extracts features from the filtered sensor dataset. A feature is an individual measurable characteristic of the sensor dataset that is critical for detecting and classifying the anomaly. In some embodiments, the feature extractor 603 uses multiple algorithms to generate feature vectors in various categories, such as feature vectors for a normal condition, feature vectors for a pre-failure condition, feature vectors for a failure condition, and so on. The feature extractor 603 may apply Principal Component Analysis, Eigen vector decomposition, or autoencoder methods to extract the features. The feature vectors may be placed on the memory bit lines for comparison. The feature extractor 603 may be an embodiment of the feature extractor 140 in FIG. 1.

The training model 604 continuously trains the diagnostics model 607, e.g., by using supervised learning. Unmatched feature and their labels may be stored as a training dataset. The training model 604 generates and forwards control signals for in-line training and pattern recognition. The training module 604 is an embodiment of the training module 155 in FIG. 1.

The column decoders 605A receive byte-sized feature vectors and control the data operation on 8-bit boundaries. In other embodiments, a feature vector may have a bit width in a range from 1 bit to N bits, where N is an integer greater than 1. In FIG. 6A, the computation moves from left to right in every cycle. The match controller 605B is a match control logic that places the bit-aligned feature vectors for parallel comparisons against all the model neurons in the entire array in the diagnostics model 607. The row decoders 606A and match controller 606B operate in similar ways as the column decoder 605A and match controller 605B.

Figure 6B:
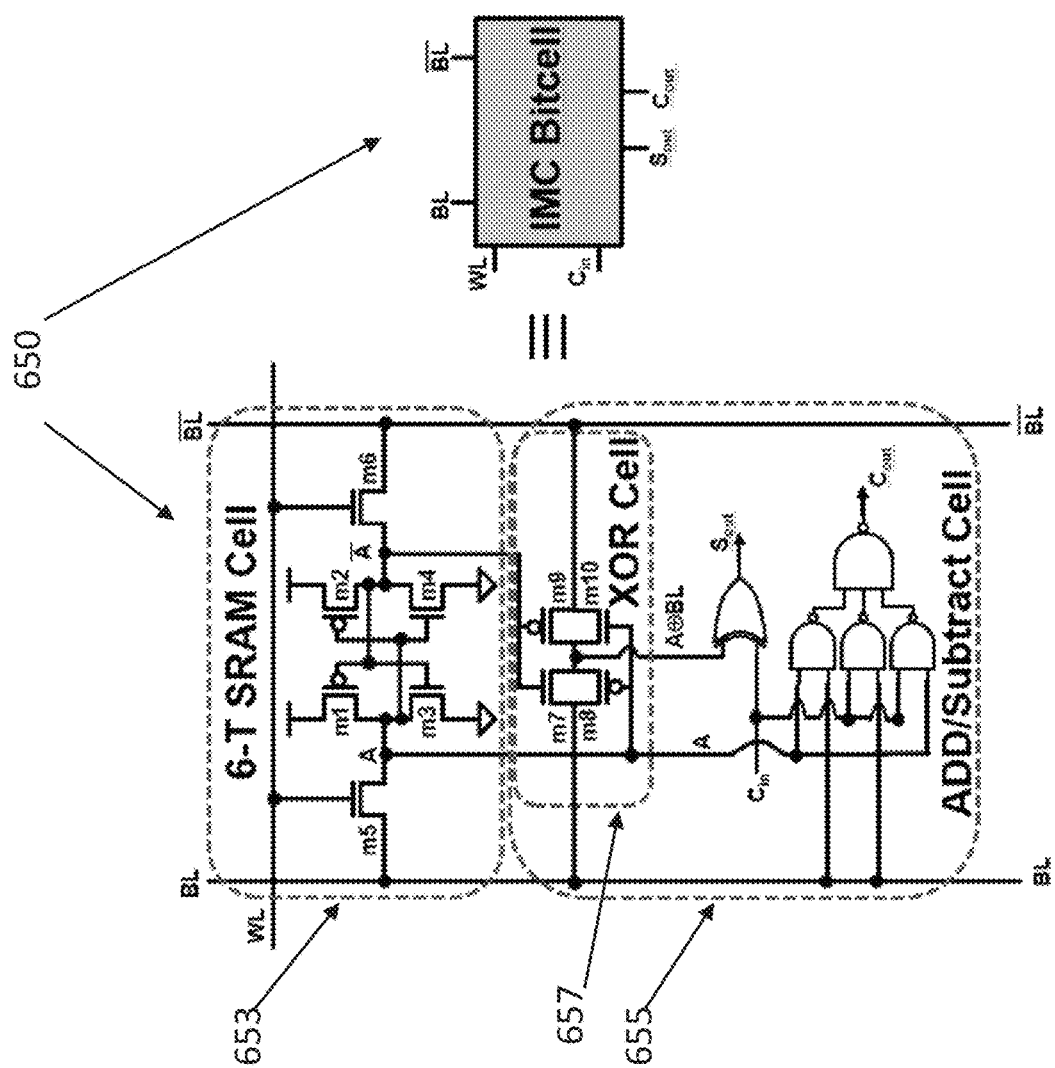
FIG. 6B illustrates an example in-memory computing bit cell, in accordance with various embodiments.

The diagnostics model 607 receives the bit-aligned feature vectors from the match controllers 605B and 606B and detects anomaly based on the bit-aligned feature vectors. In the embodiment of FIG. 6A, the diagnostics model 607 includes a first layer 610, a second layer 620, and a third layer 630. The first layer 610 includes bit-cells 613A-C, 615A-C, and 617A-C. A bit-cell is an in-memory computing bit-cell, an embodiment of which is shown in FIG. 6B. A bit-cell is also referred to as a neuron. The bit-cells 613A-C, 615A-C, and 617A-C may be divided into three groups: the first group includes the bit-cells 613A-C, the second group includes the bit-cells 615A-C, and the third group includes the bit-cells 617A-C. Each group is a row (also referred to as "neural row") and may correspond to a different reference dataset, i.e., a different anomaly classification. Each bit-cell may perform a subtraction operation to determine a distance value based on a feature vector. Each row also includes a multiplexer 614, 624, or 634. Each row incorporates an Add/Subtract result with the multiplexer 614, 624, or 634. The multiplexer 614, 624, or 634 generates an intermediate distance value based on outputs from the bit-cells 613, 615, or 617 in the row and forwards the intermediate distance values to the second layer 620. In some embodiments, the multiplexer 614, 624, or 634 also advances by 8-bits to the right of every cycle, consistent with a byte-sized comparison against an incoming data sample of every cycle.

The second layer 620 includes accumulators 623, 625, and 627. An accumulator may be a circuit capable of aggregating values. Each accumulator corresponds to a different group of bit-cells in the first layer 610. The accumulator 623 corresponds to the bit-cells 613A-C. The accumulator 625 corresponds to the bit-cells 615A-C. The accumulator 627 corresponds to the bit-cells 617A-C. Each accumulator receives intermediate distances from the corresponding group/row and performs a summation to determine a weighted sum of the intermediate distances. The weight of each distance vector may be the weight of the reference value used to determine the distance vector. Each accumulator outputs a final distance value, which may be 8-bit. The final distance values are input into the third layer for classification.

The third layer 630 includes a classifier 640 that receives the final distance values from the second layer 620. The classifier 640 may be a processing circuit capable of determining whether an anomaly in a classification occurred in the IC based on the output of the second layer 620. For each final distance value, the classifier 640 determines whether there is an anomaly in the classification. In some embodiments, the classifier 640 may compare the final distance value with a threshold for the classification. In response to determining that the final distance value is equal to or larger than the threshold, the classifier 640 determines that the anomaly is in the classification. In response to determining that the final distance value is smaller than the threshold, the classifier 640 determines that the anomaly is not in the classification.

In some embodiments, the final distance values are sorted, and a positive classification is provided for the neuron with the smallest distance using a WTA (winner-takes-all) protocol. During training, it is possible for multiple neurons/ rows to point to the same output class to account for variations in signal features. A look-up table (LUT) stores the association between the winning columns and the output class. In addition, based on the distance threshold, it is possible to have a "no-match" result. In such a case, the input feature vector can be saved in the array as new training data. The diagnostics model 607 can be updated by further training with the new training data. For instance, internal parameters (e.g., as reference dataset) of the diagnostics model 607 can be updated. In some embodiments, each neural row has a tag memory bit which can be set to "trained" or "available". An available row can be updated/ filled with the updated internal parameters for subsequent matching and inference. During initialization, the tag memory bits are fully reset and subsequently set when the array is populated with trained model weights.

In some embodiments, the in-situ neural pattern matching engine 600 is fast recognizing time-series patterns with a latency of 19 cycles after the arrival of the last sample at the end of each 256-cycle window. The latency is comprised of N input data cycles/samples+1 cycle CAM match+1 cycle accumulation+16 cycle distance sort latency+1 cycle LUT lookup for output, where N is an integer.

The architecture of the in-situ neural pattern matching engine 600 in FIG. 6A is advantageous. As the in-situ neural pattern matching engine 600 in the same IC as the sensors, the time latency from the sensors' output of the sensor dataset to the detection of the anomaly is minimized. Also, by using in-memory computing bit-cells as bit-cells in the first layer 610, the in-situ neural pattern matching engine 600 is capable of fast calculation of all the distance vectors in parallel, so the latency can be further reduced. For purpose of illustration, the embodiment of FIG. 6a includes three groups of bit-cells in the first layer 610 and three accumulators in the second layer 620. In other embodiments, the in-situ neural pattern matching engine 600 may include a different number of groups of bit-cells or a different number of accumulators.

FIG. 6B illustrates an in-memory computing bit cell 650, in accordance with various embodiments. The in-memory computing bit cell 650 is an embodiment of a bit-cell 613, 615, or 617 in FIG. 6A. The in-memory computing bit cell 650 is capable of bit-wise single-cycle distance computation. In the embodiment of FIG. 6B, the in-memory computing bit cell 650 includes a 6-T static random-access memory (SRAM) cell 535 and an Add/Subtract cell 535.

The 6-T SRAM cell 535 is augmented with a full-adder cell for fast data matching. Internal parameters of the diagnostics model 607 (e.g., weights and reference samples) are stored in the 6-T SRAM cell 635.

The Add/Subtract cell 655 has an associative-memory based neural architecture, featuring a content-addressable memory (CAM) bit cell for parallel matching of an incoming time-series vector against the pre-stored model values in a single cycle. The input data values are placed on the memory bit lines (BL/BL#) for parallel comparison and matching. The Add/Subtract cell 655 includes an XOR cell 657. The XOR cell 657 provides an improved pass-transistor XOR function by using 4 transistors (m7, m8, m9, and m10), including carry propagating add/subtract logic for distance vector computation. At each bit cell (neuron), the Sum (S)/Carry (C) are computed, and the Carry is propagated to the next bit cell to enable N-bit arithmetic, where N is an integer. The Carry propagate path ($C_{in}$ to $C_{out}$) enables N-bit addition and/or subtraction.

Example Method for In-situ Detection of Anomaly

Figure 7:
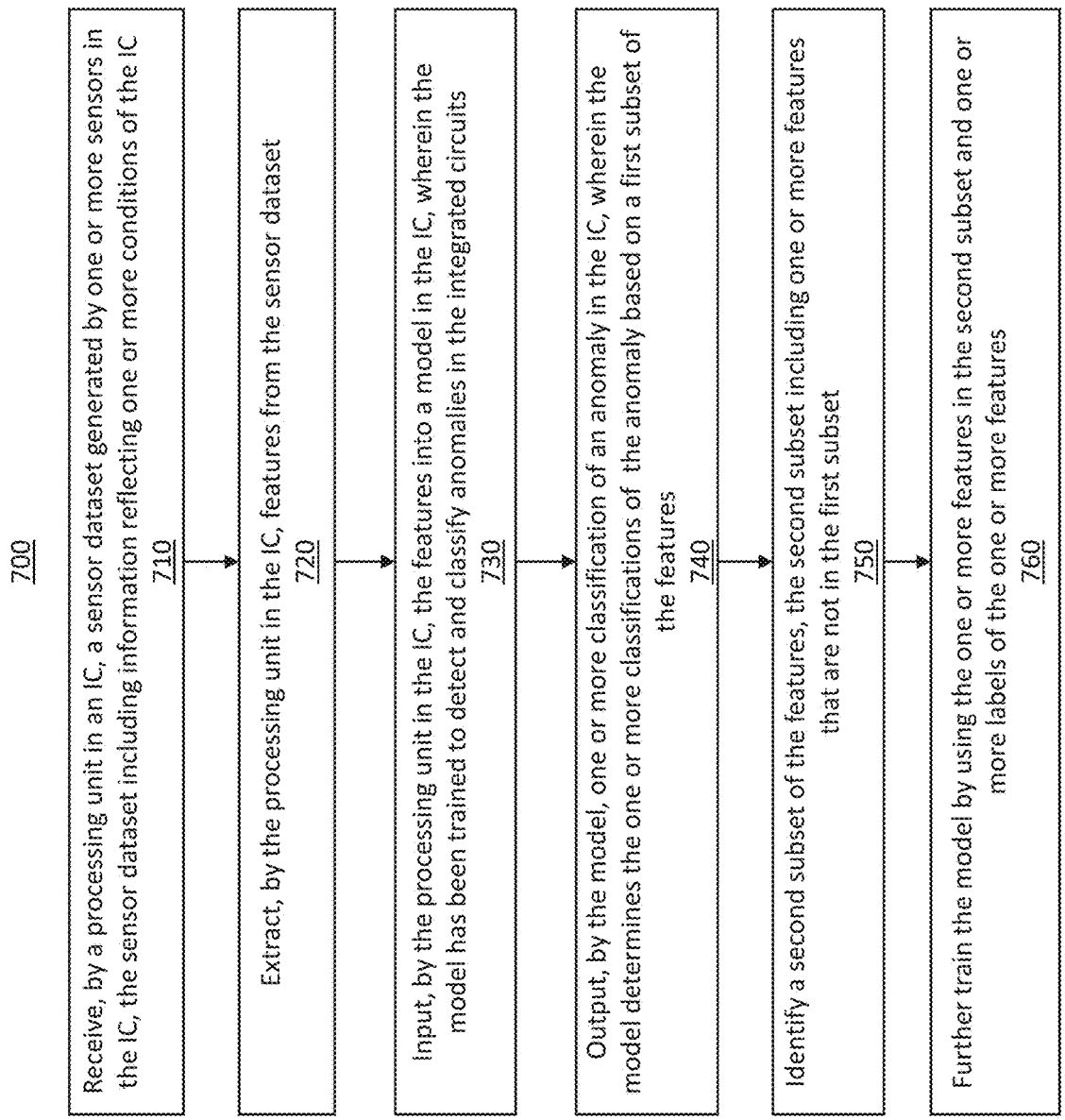
FIG. 7 is a flowchart showing a method for in-situ detection of anomalies in ICs, in accordance with various embodiments.

FIG. 7 is a flowchart showing a method for in-situ detection of an anomaly in an IC, in accordance with various embodiments. The method 700 may be performed by the IC 100 described above in conjunction with FIG. 1. Although the method 700 is described with reference to the flowchart illustrated in FIG. 7, many other methods of in-situ detection of anomalies in ICs may alternatively be used. For example, the order of execution of the steps in FIG. 7 may be changed. As another example, some of the steps may be changed, eliminated, or combined.

The IC 100 receives 710 a sensor dataset generated by one or more sensors 110 in the IC 100. In some embodiments, the processing unit 120 in the IC 100 receives the sensor dataset from the one or more sensors 110. The sensor dataset includes information reflecting one or more conditions of the IC. The one or more conditions are related to the anomaly in the IC 100. For example, one of the conditions may be the anomaly itself. As another example, the one or more conditions are the cause or consequence of the anomaly. In some embodiments, the one or more sensors are selected from a group consisting of clock sensor, temperature sensor, electrical voltage sensor, electrical current sensor, and ECC-SRAM core.

The IC 100 extracts 720 (e.g., by the processing unit 120) features from the sensor dataset. A feature is an individual measurable characteristic of the sensor dataset that is critical for detecting and classifying the anomaly. In some embodiments, the IC 100 identifies sensor data values in the sensor dataset as features. Each sensor data value of the sensor data values is associated with a corresponding timestamp. The IC 100 may identify the sensor data values based on their timestamps. For instance, the IC 100 identifies critical timestamps and extracts the sensor data values associated with the critical timestamps from the sensor dataset as the features.

In some embodiments, the IC 100 may process the sensor dataset before the IC 100 extracts the feature. For instance, the IC 100 filters noise in the sensor dataset from signals of interest in the sensor dataset and generates a filtered sensor dataset. The IC 100 then extracts the feature from the filtered sensor dataset.

The IC 100 inputs 730 (e.g., by the processing unit 120) the features into a trained model in the IC 100, such as the diagnostics model 150. The diagnostics model 150 has been trained to detect and classify anomalies in ICs based on sensor data. In some embodiments, the diagnostics model 150 is trained by a system external to the IC 100, such as the model trainer 240.

In some embodiments, the diagnostics model 150 has a network in the IC 100. The network includes a first layer, a second layer, and a third layer. The first layer includes processing elements. The processing elements may be divided into groups. Each group corresponds to a reference dataset that has been previously generated for a particular classification of anomalies. Each processing element in the group receives (e.g., from the processing unit 120) a sensor data value in the sensor dataset and a reference value in the reference dataset. The processing element determines a distance vector that represents a difference between the sensor data value and the reference value. Each group in the first layer outputs a plurality of such distance vectors.

The second layer includes aggregating circuits. Each aggregating circuit corresponds to a different group of processing elements in the first layer. The aggregating circuit receives the distance vectors from the corresponding group and determines a weighted sum of the distance vectors. The weight of each distance vector is determined based on the weight of the reference value used to determine the distance vector. The weights and references samples in the reference dataset are internal parameters of the diagnostics model 150 and are determined during the process of training the diagnostics model 150. The second layer outputs a plurality of weighted sums.

The third layer includes a classifier. The classifier receives the weighted sums from the second layers and determines a classification of the anomaly based on each weighted sum. In some embodiments, the classifier may determine a classification of the anomaly by comparing the weighted sum with a threshold for the classification. In response to determining that the weighted sum is equal to or larger than the threshold, the classifier determine that the anomaly is in the classification. In response to determining that the weighted sum is smaller than the threshold, the classifier determine that the anomaly is not in the classification.

The IC 100 outputs 740 (e.g., by the diagnostics model 150) one or more classifications of the anomaly in the IC. The diagnostics model 150 determines the one or more classifications of the anomaly based on a first subset of the features. The IC 100 identifies 750 a second subset of the features. The second subset includes one or more features that are not in the first subset.

The IC 100 further trains 760 the diagnostic model 150 based on the one or more features in the second subset and one or more labels of the one or more features. A feature in the second subset is a feature based on which the diagnostic model 150 fails to detect or to classify an anomaly. For instance, the diagnostic model 150 determines that the classification of the feature is unknown or determines that the probability of the feature falling into a classification is too low, e.g., lower than a threshold probability. The IC 100 may determine the label of the feature. For example, the IC 100 may label the feature as a normal condition. In another example, the IC may label the feature as a new classification of anomaly that is not included in the model. Additionally or alternatively, the label of the feature may be determined by an external system, e.g., the training and support system 210, or a user associated with the IC 100.

In some embodiments, the one or more classifications of the anomaly is provided to another processing unit in the IC 100, e.g., the anomaly mitigation module 160, to mitigate the anomaly based on the one or more classifications of the anomaly. For instance, the anomaly mitigation module 160 may generate a solution for mitigating the anomaly based on each classification of the anomaly. The anomaly mitigation module 160 may take an action based on the solution to mitigate the anomaly. Alternatively or additionally, the anomaly mitigation module 160 may provide the solution to another component of the IC 100, e.g., the processing unit 170 or memory 180, to take the action and mitigate the anomaly. In other embodiments, the anomaly mitigation module 160 may send a message to a system external to the IC 100, such as the IC controller 260, to inform the external system of the one or more classifications of the anomaly. The external system may take an action to mitigate the anomaly.

Example Computing Device

Figure 8:
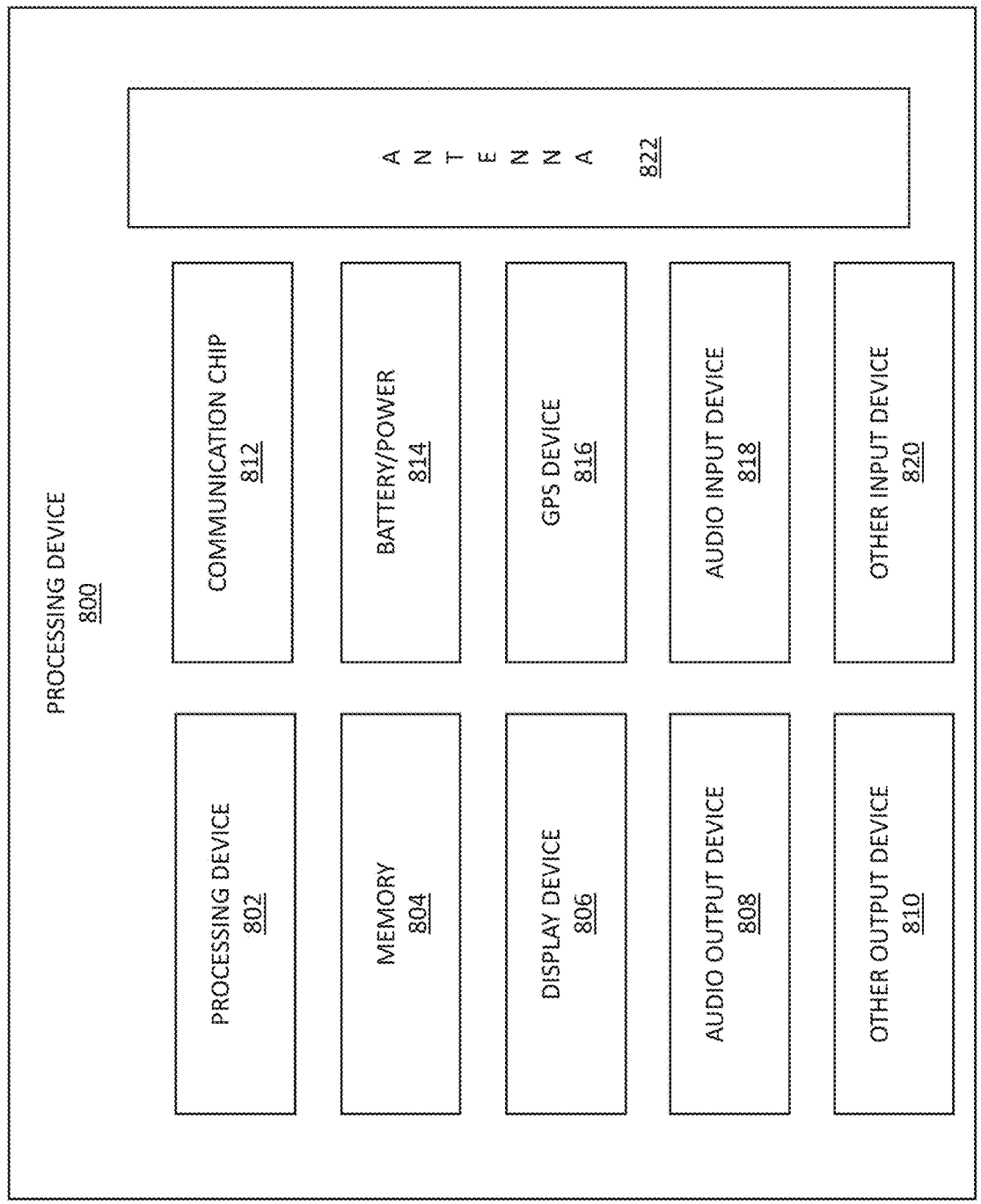
FIG. 8 is a block diagram of an example computing system for use as the model trainer in FIG. 3, in accordance with various embodiments.

FIG. 8 is a block diagram of an example computing system for use as the model trainer 240, in accordance with various embodiments. A number of components are illustrated in FIG. 8 as included in the computing system 800, but any one or more of these components may be omitted or duplicated, as suitable for the application. In some embodiments, some or all of the components included in the computing system 800 may be attached to one or more motherboards. In some embodiments, some or all of these components are fabricated onto a single system on a chip (SoC) die. Additionally, in various embodiments, the computing system 800 may not include one or more of the components illustrated in FIG. 8, but the computing system 800 may include interface circuitry for coupling to the one or more components. For example, the computing system 800 may not include a display device 806, but may include display device interface circuitry (e.g., a connector and driver circuitry) to which a display device 806 may be coupled. In another set of examples, the computing system 800 may not include an audio input device 818 or an audio output device 808, but may include audio input or output device interface circuitry (e.g., connectors and supporting circuitry) to which an audio input device 818 or audio output device 808 may be coupled.

The computing system 800 may include a processing device 802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 802 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing system 800 may include a memory 804, which may itself include one or more memory devices such as volatile memory (e.g., DRAM), nonvolatile memory (e.g., read-only memory (ROM)), flash memory, solid state memory, and/or a hard drive. In some embodiments, the memory 804 may include memory that shares a die with the processing device 802. In some embodiments, the memory 804 includes one or more non-transitory computer-readable media storing instructions executable to perform operations for in-situ detection of anomalies in ICs, e.g., the method 700 described above in conjunction with FIG. 7. The instructions stored in the one or more non-transitory computer-readable media may be executed by the processing device 802.

In some embodiments, the computing system 800 may include a communication chip 812 (e.g., one or more communication chips). For example, the communication chip 812 may be configured for managing wireless communications for the transfer of data to and from the computing system 800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 812 may implement any of a number of wireless standards or protocols, including but not limited to Institute for Electrical and Electronic Engineers (IEEE) standards including Wi-Fi (IEEE 802.8 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 812 may operate in accordance with CDMA, Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 812 may operate in accordance with other wireless protocols in other embodiments. The computing system 800 may include an antenna 822 to facilitate wireless communications and/or to receive other wireless communications (such as AM or FM radio transmissions).

In some embodiments, the communication chip 812 may manage wired communications, such as electrical, optical, or any other suitable communication protocols (e.g., the Ethernet). As noted above, the communication chip 812 may include multiple communication chips. For instance, a first communication chip 812 may be dedicated to shorter-range wireless communications such as Wi-Fi or Bluetooth, and a second communication chip 812 may be dedicated to longer-range wireless communications such as global positioning system (GPS), EDGE, GPRS, CDMA, WiMAX, LTE, EV-DO, or others. In some embodiments, a first communication chip 812 may be dedicated to wireless communications, and a second communication chip 812 may be dedicated to wired communications.

The computing system 800 may include battery/power circuitry 814. The battery/power circuitry 814 may include one or more energy storage devices (e.g., batteries or capacitors) and/or circuitry for coupling components of the computing system 800 to an energy source separate from the computing system 800 (e.g., AC line power).

The computing system 800 may include a display device 806 (or corresponding interface circuitry, as discussed above). The display device 806 may include any visual indicators, such as a heads-up display, a computer monitor, a projector, a touchscreen display, a liquid crystal display (LCD), a light-emitting diode display, or a flat panel display, for example.

The computing system 800 may include an audio output device 808 (or corresponding interface circuitry, as discussed above). The audio output device 808 may include any device that generates an audible indicator, such as speakers, headsets, or earbuds, for example.

The computing system 800 may include an audio input device 818 (or corresponding interface circuitry, as discussed above). The audio input device 818 may include any device that generates a signal representative of a sound, such as microphones, microphone arrays, or digital instruments (e.g., instruments having a musical instrument digital interface (MIDI) output).

The computing system 800 may include a GPS device 816 (or corresponding interface circuitry, as discussed above). The GPS device 816 may be in communication with a satellite-based system and may receive a location of the computing system 800, as known in the art.

The computing system 800 may include an other output device 88 (or corresponding interface circuitry, as discussed above). Examples of the other output device 88 may include an audio codec, a video codec, a printer, a wired or wireless transmitter for providing information to other devices, or an additional storage device.

The computing system 800 may include another input device 820 (or corresponding interface circuitry, as discussed above). Examples of the other input device 820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing system 800 may have any desired form factor, such as a handheld or mobile computing system (e.g., a cell phone, a smart phone, a mobile internet device, a music player, a tablet computer, a laptop computer, a netbook computer, an ultrabook computer, a PDA, an ultramobile personal computer, etc.), a desktop computing system, a server or other networked computing component, a printer, a scanner, a monitor, a set-top box, an entertainment control unit, a vehicle control unit, a digital camera, a digital video recorder, or a wearable computing system. In some embodiments, the computing system 800 may be any other electronic device that processes data.

Select Examples

The following paragraphs provide various examples of the embodiments disclosed herein.

Example 1 provides a method for in-situ detection of an anomaly in an integrated circuit (IC), the method including: receiving, by a processing unit in the IC, a sensor dataset generated by one or more sensors in the IC, the sensor dataset including information reflecting one or more conditions of the IC; extracting, by the processing unit in the IC, features from the sensor dataset; inputting, by the processing unit in the IC, the features into a model in the IC, where the model has been trained to detect and classify anomalies in integrated circuits; outputting, by the model, one or more classifications of the anomaly in the IC, where the model determines the one or more classifications of the anomaly based on a first subset of the features; identifying a second subset of the features, the second subset of features including one or more features that are not in the first subset; and further training the model by using the one or more features in the second subset and one or more labels of the one or more features.

Example 2 provides the method of example 1, further including: mitigating, by another processing unit in the IC, the anomaly based on the one or more classifications of the anomaly.

Example 3 provides the method of example 1, where extracting the features from the sensor dataset includes: generating a filtered sensor dataset by separating noise in the sensor dataset from signals of interest in the sensor dataset; and extracting the features from the filtered sensor dataset.

Example 4 provides the method of example 1, where extracting the features from the sensor dataset includes identifying sensor data values in the sensor dataset, each respective sensor data value of the sensor data values associated with a timestamp, the model identifies a reference value from a reference dataset based on the timestamp, and the model determines a distance vector in a two-dimensional vector space based on the respective sensor data value and the reference value, the distance vector representing a difference between the respective sensor data value and the reference value.

Example 5 provides the method of example 1, where the model includes: a first layer including a first group of processing elements, each of the processing elements in the first group configured to: receive a sensor data value in the sensor dataset and a reference value in a first reference dataset as an input, the sensor data value and reference value in the first reference dataset are associated with a same timestamp, and output a first distance vector in a two-dimensional vector space, the first distance vector representing a difference between the sensor data value and the reference value in the first reference dataset; a second layer configured to receive the first distance vectors from the processing elements in the first group as a first input and to output a weighted sum of the first distance vectors determined by the processing elements in the first group; and a third layer configured to receive the weighted sum of the first distance vectors as a first input and to output a first classification of the anomaly.

Example 6 provides the method of example 5, where the first layer further includes a second group of processing elements, each of the processing elements in the second group configured to: receive a sensor data value in the sensor dataset and a reference value in a second reference dataset as an input, the sensor data value and reference value in the second reference dataset are associated with a same timestamp, and output a second distance vector in a two-dimensional vector space, the second distance vector representing a difference between the sensor data value and the reference value in the second reference dataset, where: the second layer is further configured to receive the second distance vectors from the processing elements in the second group as a second input and to output a weighted sum of the second distance vectors determined by the processing elements in the second group, and the third layer is further configured to receive the weighted sum of the second distance vectors as a second input and to output a second classification of the anomaly.

Example 7 provides the method of example 1, where a processing element in the model is an in-memory computing bit cell.

Example 8 provides an IC for in-situ detection of an anomaly in the IC, the IC including: one or more sensors configured to generate a sensor dataset including information indicating one or more conditions in the IC; a memory configured to store the sensor dataset; a preprocessing module configured to receive the sensor dataset and to extract features from the sensor dataset; a network of in-memory computing bit cells configured to: receive the extracted features, and determine one or more classifications of the anomaly in the IC using a first subset of the features, where the network has been trained to detect and classify anomalies in integrated circuits; and a training module configured to: identify a second subset of the features, the second subset of features including one or more features that are not in the first subset; and further train the network by using the one or more features in the second subset and one or more labels of the one or more features.

Example 9 provides the IC of example 8, further including: another processing unit configured to mitigate the anomaly based on the one or more classifications of the anomaly.

Example 10 provides the IC of example 8, where the preprocessing module is configured to extract the features from the sensor dataset by: generating a filtered sensor dataset by separating noise in the sensor dataset from signals of interest in the sensor dataset; and extracting the features from the filtered sensor dataset.

Example 11 provides the IC of example 8, where the preprocessing module is configured to extract the features from the sensor dataset by identifying sensor data values in the sensor dataset, each respective sensor data value of the sensor data values associated with a timestamp, and where the network is configured to: identify a reference value from the reference dataset based on the timestamp, and determine a distance vector in a two-dimensional vector space based on the respective sensor data value and the reference value, the distance vector representing a difference between the respective sensor data value and the reference value.

Example 12 provides the IC of example 8, where the network includes: a first layer including a first group of in-memory computing bit cells, each of the in-memory computing bit cells in the first group configured to: receive a sensor data value in the sensor dataset and a reference value in a first reference dataset as an input, the sensor data value and reference value in the first reference dataset are associated with a same timestamp, and output a first distance in a two-dimensional vector space, the first distance representing a difference between the sensor data value and the reference value in the first reference dataset; a second layer configured to receive the first distances from the in-memory computing bit cells in the first group as a first input and to output a weighted sum of the first distances determined by the in-memory computing bit cells in the first group; and a third layer configured to receive the weighted sum of the first distances as a first input and to output a first classification of the anomaly.

Example 13 provides the IC of example 12, where the first layer further includes a second group of in-memory computing bit cells, each of the in-memory computing bit cells in the second group configured to: receive a sensor data value in the sensor dataset and a reference value in a second reference dataset as an input, the sensor data value and reference value in the second reference dataset are associated with a same timestamp, and output a second distance in a two-dimensional vector space, the second distance representing a difference between the sensor data value and the reference value in the second reference dataset, where: the second layer is further configured to receive the second distances from the in-memory computing bit cells in the second group as a second input and to output a weighted sum of the second distances determined by the in-memory computing bit cells in the second group; and the third layer is further configured to receive the weighted sum of the second distances as a second input and to output a second classification of the anomaly.

Example 14 provides the IC of example 8, where the one or more sensors are selected from a group consisting of clock sensor, temperature sensor, electrical voltage sensor, electrical current sensor, and ECC (error correcting code)-SRAM (static random-access memory) core.

Example 15 provides one or more non-transitory computer-readable media storing instructions executable to perform operations for in-situ detection of an anomaly in an integrated circuit (IC), the operations including: receiving, by a processing unit in the IC, a sensor dataset generated by one or more sensors in the IC, the sensor dataset including information reflecting one or more conditions of the IC; extracting, by the processing unit in the IC, features from the sensor dataset; inputting, by the processing unit in the IC, the features into a model in the IC, where the model has been trained to detect and classify anomalies in integrated circuits; outputting, by the model, one or more classifications of the anomaly in the IC, where the model determines the one or more classifications of the anomaly based on a first subset of the features; identifying a second subset of the features, the second subset of features including one or more features that are not in the first subset; and further training the model by using the one or more features in the second subset and one or more labels of the one or more features.

Example 16 provides the one or more non-transitory computer-readable media of example 15, where the operations further include: mitigating, by another processing unit in the IC, the anomaly based on the one or more classifications of the anomaly.

Example 17 provides the one or more non-transitory computer-readable media of example 15, where extracting the features from the sensor dataset includes: generating a filtered sensor dataset by separating noises in the sensor dataset from signals of interest in the sensor dataset; and extracting the features from the filtered sensor dataset.

Example 18 provides the one or more non-transitory computer-readable media of example 15, where extracting the features from the sensor dataset includes identifying sensor data values in the sensor dataset, each respective sensor data value of the sensor data values associated with a timestamp, the model identifies a reference value from a reference dataset based on the timestamp, and the model determines a distance vector in a two-dimensional vector space based on the respective sensor data value and the reference value, the distance vector representing a difference between the respective sensor data value and the reference value.

Example 19 provides the one or more non-transitory computer-readable media of example 15, where the model includes: a first layer including a first group of processing elements, each of the processing elements in the first group configured to: receive a sensor data value in the sensor dataset and a reference value in a first reference dataset as an input, the sensor data value and reference value in the first reference dataset are associated with a same timestamp, and output a first distance vector in a two-dimensional vector space, the first distance vector representing a difference between the sensor data value and the reference value in the first reference dataset; a second layer configured to receive the first distance vectors from the processing elements in the first group as a first input and to output a weighted sum of the first distance vectors determined by the processing elements in the first group; and a third layer configured to receive the weighted sum of the first distance vectors as a first input and to output a first classification of the anomaly.

Example 20 provides the one or more non-transitory computer-readable media of example 19, where the first layer further includes a second group of processing elements, each of the processing elements in the second group configured to: receive a sensor data value in the sensor dataset and a reference value in a second reference dataset as an input, the sensor data value and reference value in the second reference dataset are associated with a same timestamp, and output a second distance vector in a two-dimensional vector space, the second distance vector representing a difference between the sensor data value and the reference value in the second reference dataset, where: the second layer is further configured to receive the second distance vectors from the processing elements in the second group as a second input and to output a weighted sum of the second distance vectors determined by the processing elements in the second group, and the third layer is further configured to receive the weighted sum of the second distance vectors as a second input and to output a second classification of the anomaly.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. A method for in-situ detection of an anomaly in an integrated circuit (IC), the method comprising:
   receiving, by a processing unit in the IC, a sensor dataset generated by one or more sensors in the IC, the sensor dataset including information reflecting one or more conditions of the IC;
   extracting, by the processing unit in the IC, features from the sensor dataset;
   inputting, by the processing unit in the IC, the features into a model in the IC, wherein the model has been trained to detect and classify anomalies in integrated circuits;
   outputting, by the model, one or more classifications of the anomaly in the IC, wherein the model determines the one or more classifications of the anomaly based on a first subset of the features;
   identifying a second subset of the features, the second subset of features including one or more features that are not in the first subset; and
   further training the model by using the one or more features in the second subset and one or more labels of the one or more features.

2. The method of claim 1, further comprising:
   mitigating, by another processing unit in the IC, the anomaly based on the one or more classifications of the anomaly.

3. The method of claim 1, wherein extracting the features from the sensor dataset comprises:
   generating a filtered sensor dataset by separating noise in the sensor dataset from signals of interest in the sensor dataset; and
   extracting the features from the filtered sensor dataset.

4. The method of claim 1, wherein extracting the features from the sensor dataset comprises identifying sensor data values in the sensor dataset, each respective sensor data value of the sensor data values associated with a timestamp, the model identifies a reference value from a reference dataset based on the timestamp, and the model determines a distance vector in a two-dimensional vector space based on the respective sensor data value and the reference value, the distance vector representing a difference between the respective sensor data value and the reference value.

5. The method of claim 1, wherein the model comprises:
   a first layer comprising a first group of processing elements, each of the processing elements in the first group configured to:
      receive a sensor data value in the sensor dataset and a reference value in a first reference dataset as an input, the sensor data value and reference value in the first reference dataset are associated with a same timestamp, and
      output a first distance vector in a two-dimensional vector space, the first distance vector representing a difference between the sensor data value and the reference value in the first reference dataset;
   a second layer configured to receive the first distance vectors from the processing elements in the first group as a first input and to output a weighted sum of the first distance vectors determined by the processing elements in the first group; and
   a third layer configured to receive the weighted sum of the first distance vectors as a first input and to output a first classification of the anomaly.

6. The method of claim 5, wherein the first layer further comprises a second group of processing elements, each of the processing elements in the second group configured to:
   receive a sensor data value in the sensor dataset and a reference value in a second reference dataset as an input, the sensor data value and reference value in the second reference dataset are associated with a same timestamp, and
   output a second distance vector in a two-dimensional vector space, the second distance vector representing a difference between the sensor data value and the reference value in the second reference dataset,
   wherein:
      the second layer is further configured to receive the second distance vectors from the processing elements in the second group as a second input and to output a weighted sum of the second distance vectors determined by the processing elements in the second group, and the third layer is further configured to receive the weighted sum of the second distance vectors as a second input and to output a second classification of the anomaly.

7. The method of claim 1, wherein a processing element in the model is an in-memory computing bit cell.

8. An integrated circuit (IC) for in-situ detection of an anomaly in the IC, the IC comprising:
one or more sensors configured to generate a sensor dataset including information indicating one or more conditions in the IC;
a memory configured to store the sensor dataset;
a preprocessing module configured to receive the sensor dataset and to extract features from the sensor dataset;
a network of in-memory computing bit cells configured to:
receive the extracted features, and
determine one or more classifications of the anomaly in the IC using a first subset of the features,
wherein the network has been trained to detect and classify anomalies in integrated circuits; and
a training module configured to:
identify a second subset of the features, the second subset of features including one or more features that are not in the first subset; and
further train the network by using the one or more features in the second subset and one or more labels of the one or more features.

9. The IC of claim 8, further comprising:
another processing unit configured to mitigate the anomaly based on the one or more classifications of the anomaly.

10. The IC of claim 8, wherein the preprocessing module is configured to extract the features from the sensor dataset by:
generating a filtered sensor dataset by separating noise in the sensor dataset from signals of interest in the sensor dataset; and
extracting the features from the filtered sensor dataset.

11. The IC of claim 8, wherein the preprocessing module is configured to extract the features from the sensor dataset by identifying sensor data values in the sensor dataset, each respective sensor data value of the sensor data values associated with a timestamp, and wherein the network is configured to:
identify a reference value from the reference dataset based on the timestamp, and
determine a distance vector in a two-dimensional vector space based on the respective sensor data value and the reference value, the distance vector representing a difference between the respective sensor data value and the reference value.

12. The IC of claim 8, wherein the network comprises:
a first layer comprising a first group of in-memory computing bit cells, each of the in-memory computing bit cells in the first group configured to:
receive a sensor data value in the sensor dataset and a reference value in a first reference dataset as an input, the sensor data value and reference value in the first reference dataset are associated with a same timestamp, and
output a first distance in a two-dimensional vector space, the first distance representing a difference between the sensor data value and the reference value in the first reference dataset;
a second layer configured to receive the first distances from the in-memory computing bit cells in the first group as a first input and to output a weighted sum of the first distances determined by the in-memory computing bit cells in the first group; and
a third layer configured to receive the weighted sum of the first distances as a first input and to output a first classification of the anomaly.

13. The IC of claim 12, wherein the first layer further comprises a second group of in-memory computing bit cells, each of the in-memory computing bit cells in the second group configured to:
receive a sensor data value in the sensor dataset and a reference value in a second reference dataset as an input, the sensor data value and reference value in the second reference dataset are associated with a same timestamp, and
output a second distance in a two-dimensional vector space, the second distance representing a difference between the sensor data value and the reference value in the second reference dataset,
wherein:
the second layer is further configured to receive the second distances from the in-memory computing bit cells in the second group as a second input and to output a weighted sum of the second distances determined by the in-memory computing bit cells in the second group; and
the third layer is further configured to receive the weighted sum of the second distances as a second input and to output a second classification of the anomaly.

14. The IC of claim 8, wherein the one or more sensors are selected from a group consisting of clock sensor, temperature sensor, electrical voltage sensor, electrical current sensor, and ECC (error correcting code)-SRAM (static random-access memory) core.

15. One or more non-transitory computer-readable media storing instructions executable to perform operations for in-situ detection of an anomaly in an integrated circuit (IC), the operations comprising:
receiving, by a processing unit in the IC, a sensor dataset generated by one or more sensors in the IC, the sensor dataset including information reflecting one or more conditions of the IC;
extracting, by the processing unit in the IC, features from the sensor dataset;
inputting, by the processing unit in the IC, the features into a model in the IC, wherein the model has been trained to detect and classify anomalies in integrated circuits;
outputting, by the model, one or more classifications of the anomaly in the IC, wherein the model determines the one or more classifications of the anomaly based on a first subset of the features;
identifying a second subset of the features, the second subset of features including one or more features that are not in the first subset; and
further training the model by using the one or more features in the second subset and one or more labels of the one or more features.

16. The one or more non-transitory computer-readable media of claim 15, wherein the operations further comprise:
mitigating, by another processing unit in the IC, the anomaly based on the one or more classifications of the anomaly.

17. The one or more non-transitory computer-readable media of claim 15, wherein extracting the features from the sensor dataset comprises:

generating a filtered sensor dataset by separating noises in the sensor dataset from signals of interest in the sensor dataset; and extracting the features from the filtered sensor dataset.

18. The one or more non-transitory computer-readable media of claim 15, wherein extracting the features from the sensor dataset comprises identifying sensor data values in the sensor dataset, each respective sensor data value of the sensor data values associated with a timestamp, the model identifies a reference value from a reference dataset based on the timestamp, and the model determines a distance vector in a two-dimensional vector space based on the respective sensor data value and the reference value, the distance vector representing a difference between the respective sensor data value and the reference value.

19. The one or more non-transitory computer-readable media of claim 15, wherein the model comprises:

a first layer comprising a first group of processing elements, each of the processing elements in the first group configured to:

receive a sensor data value in the sensor dataset and a reference value in a first reference dataset as an input, the sensor data value and reference value in the first reference dataset are associated with a same timestamp, and output a first distance vector in a two-dimensional vector space, the first distance vector representing a difference between the sensor data value and the reference value in the first reference dataset;

a second layer configured to receive the first distance vectors from the processing elements in the first group as a first input and to output a weighted sum of the first distance vectors determined by the processing elements in the first group; and a third layer configured to receive the weighted sum of the first distance vectors as a first input and to output a first classification of the anomaly.

20. The one or more non-transitory computer-readable media of claim 19, wherein the first layer further comprises a second group of processing elements, each of the processing elements in the second group configured to:

receive a sensor data value in the sensor dataset and a reference value in a second reference dataset as an input, the sensor data value and reference value in the second reference dataset are associated with a same timestamp, and output a second distance vector in a two-dimensional vector space, the second distance vector representing a difference between the sensor data value and the reference value in the second reference dataset, wherein:

the second layer is further configured to receive the second distance vectors from the processing elements in the second group as a second input and to output a weighted sum of the second distance vectors determined by the processing elements in the second group, and the third layer is further configured to receive the weighted sum of the second distance vectors as a second input and to output a second classification of the anomaly.

* * * * *